United States Patent [19]
Perry

[11] 3,987,285
[45] Oct. 19, 1976

[54] DIGITAL MATCHED FILTERING USING A STEP TRANSFORM PROCESS

[75] Inventor: Richard Prather Perry, Haddon Heights, N.J.

[73] Assignee: RCA Corporation, New York, N.Y.

[22] Filed: Nov. 20, 1974

[21] Appl. No.: 525,444

Related U.S. Application Data
[63] Continuation of Ser. No. 357,198, May 4, 1973, abandoned.

[52] U.S. Cl. ............................. 235/152; 343/5 DP; 343/17.2 PC
[51] Int. Cl.² ......................................... G06F 15/34
[58] Field of Search ........................... 235/152, 156; 343/17.2 PC, 5 DP; 328/167; 340/15.5 DP; 325/42

[56] References Cited
UNITED STATES PATENTS

| | | | |
|---|---|---|---|
| 3,668,702 | 6/1972 | Jones | 343/5 R |
| 3,679,882 | 7/1972 | McAuliffe | 235/156 |
| 3,680,105 | 7/1972 | Goldstone | 343/17.2 PC |

*Primary Examiner*—David H. Malzahn
*Attorney, Agent, or Firm*—Edward J. Norton; Joseph D. Lazar

[57] ABSTRACT

Uncompressed linear frequency modulated signals from a radar or other type system are compressed in time by a digital matched filter employing a step transform process.

7 Claims, 5 Drawing Figures

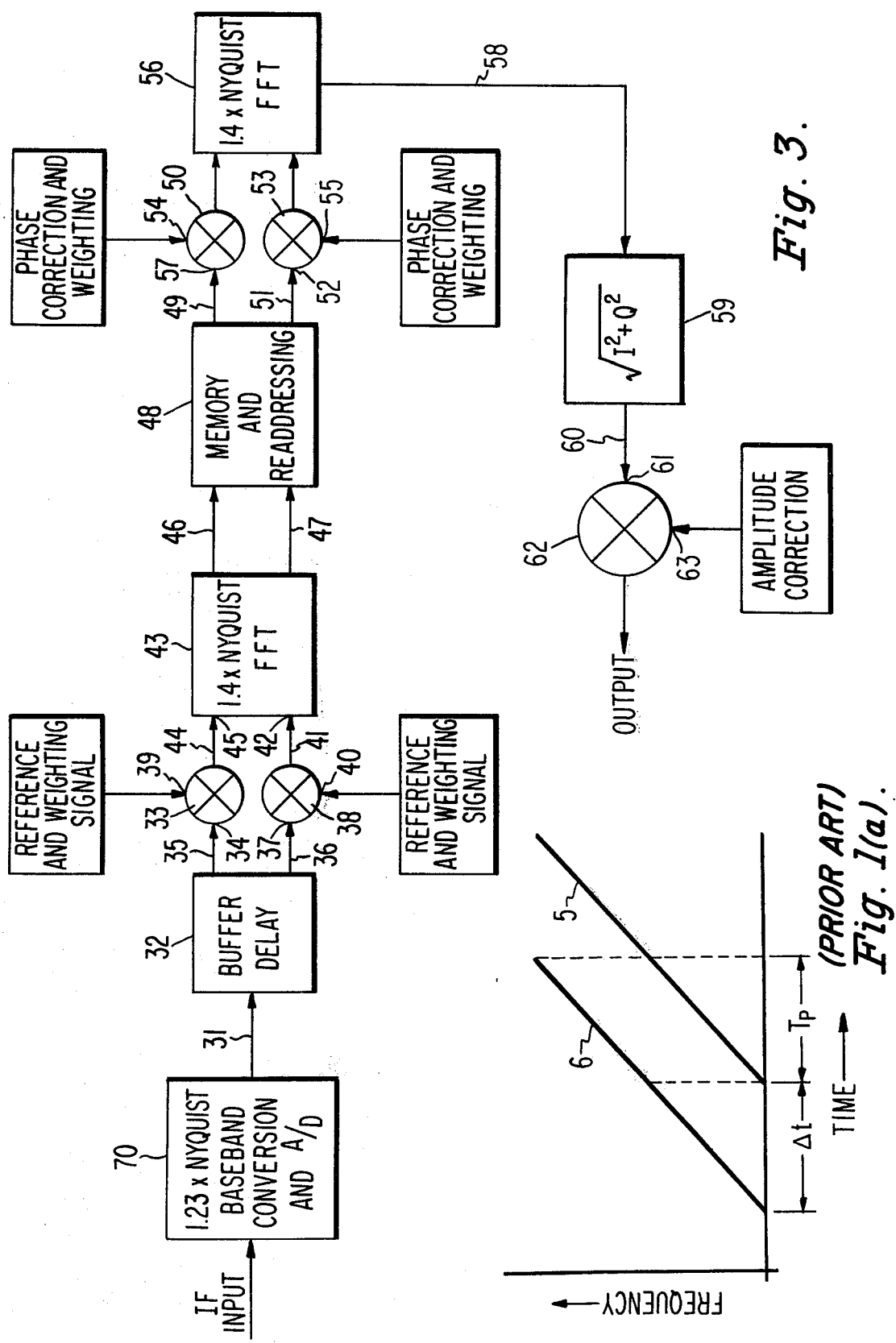

DIGITAL MATCHED FILTERING USING A STEP TRANSFORM PROCESS

CROSS REFERENCE TO RELATED APPLICATIONS

This application is a continuation of application, Ser. No. 357,198, filed May 4, 1973 now abandoned.

BACKGROUND OF THE INVENTION

1. Field of the Invention

This invention relates to digital matched filters using Fast Fourier Transform devices.

2. Description of the Prior Art

Pulse compression filters or digital matched filters using Fast Fourier Transform (FFT) devices are well known in the prior art. Such filters are described in a paper entitled "Digital Matched Filters Using Fast Fourier Transforms" by H. M. Halpern and R. P. Perry in the EASCON 1971 Proceedings, pp. 220–230, published by the Institute of Electrical and Electronic Engineers, Inc.

In prior art systems, a stored linear frequency modulated (FM) reference signal is combined with a second linear FM signal, in a suitable mixer or signal multiplier unit. As an example, the second linear FM signal may be the intermediate frequency (IF) signal from a radar receiver. The resultant continuous wave (CW) mixer output signal, in the time domain is then processsed by a first Fast Fourier Transform device which transforms the time domain mixer output signal to a signal in the frequency domain. The frequency domain output signal from the FFT may then be further processed by additional system devices in order to meet desired system specifications with respect to a desired pulse compressed system output signal in the time domain.

The magnitude of the prior art mixer output signal is proportional to an arbitrary time, $\Delta t$, which is measured from the time an IF signal is coupled to a mixer input port relative to the time at which the reference signal is coupled to a different mixer input port. As the arbitrary time, $\Delta t$, of the IF signal coupling increases, the magnitude of the mixer output signal decreases resulting in a decrease in IF signal resolution. For many radar applications such a limitation is not acceptable.

See for example, an article entitled "A Technique for the Time-transformation of Signals and its Application to Directional Systems," by W. J. Caputi, published in "The Radio and Electronics Engineer," March, 1965, pages 135–142. This article describes a passive time-transformation technique, termed "stretch," for combining an input linearly FM signal with a reference linearly FM signal to generate a substantially constant frequency signal that can be arranged to manifest a pulse compression or expansion of the original input FM signal.

SUMMARY OF THE INVENTION

A pulse compression filter is provided for linear frequency modulated signals. The linear frequency modulated (FM) signals are coupled to means for converting the FM signals to baseband digital signals. The baseband digital signals from the converter means are mixed with linear FM sawtooth reference signals in a multiplier to generate a stepped frequency output signal in the time domain each step having a quadratic phase component. A first Fourier transforming means coupled to the multiplier transforms the stepped frequency output signal from the time domain to the frequency domain. The frequency coefficients of signals transmitted from the first Fourier transforming means are stored and recorded in a memory and readdressing means for subsequent transmission to a means for subtracting the quadratic phase component introduced into the signal by the multiplication of the digital signals of the linear frequency modulated signals with the sawtooth reference signal. A second Fourier transforming means further analyzes an output signal from the subtracting means.

These and other features and advantages of the invention will be better understood from a consideration of the following specification taken in conjunction with accompanying drawing in which:

BRIEF DESCRIPTION OF THE DRAWING

FIG. 1(a) is a Time v. Frequency plot of an IF signal and a reference signal as used in prior art systems;

FIG. 3 is a more detailed block diagram illustrating a digital matched filtering system using a step transform process according to the invention.

DESCRIPTION OF A PREFERRED EMBODIMENT

The system, according to the invention, for digital signal processing or pulse compression uses a step transform technique. The terminology "step transform" is used to describe a method of performing pulse compression of linear frequency modulated (FM) or continuous analog type signals. Pulse compression techniques are particularly applicable in wideband radar systems where convolution techniques are used to compress the time duration of a linear FM type intermediate frequency (IF) signal from a radar receiver.

In a prior art system, convolution in the time domain may be achieved by using an element such as a Fast Fourier Transform (FFT) to transform a radar chirp (linear frequency modulated) IF signal from the time domain to the Fourier or frequency domain and multiplying or mixing the resulting discrete Fourier transform signal from the FFT with the spectrum of a fixed reference FM signal in a suitable mixer. The desired pulse compression in the time domain is obtained when the mixer output signal in the frequency domain is coupled to a suitable element such as an inverse Fast Fourier Transform ($FFT^{-1}$) which transforms a signal from the frequency domain to the time domain. Such a prior art system is described in the paper entitled "Digital Matched Filters Using Fast Fourier Transforms" by H. M. Halpern and R. P. Perry, previously described.

In another prior art system, referred to briefly above, the linear frequency modulated IF signal from the radar receiver is mixed with a linear frequency modulated reference signal. Referring to FIG. 1(a), there is shown a time-frequency plot of the signals of such a system. The IF signal 5 is coupled to the mixer at a time, $\Delta t$, which is measured relative to the time the fixed linear FM reference signal 6 is coupled to the same mixer.

The reference and IF signals 6 and 5 are simultaneously coupled to the mixer only over a common time period, $T_p$. Thus, the result of mixing the reference and IF signals 6 and 5 is a continuous wave (CW) signal transmitted by the mixer over the common time period, $T_p$, and at a frequency proportional to $\Delta t$. The magnitude of the mixer output signal is proportional to the arbitrary time, $\Delta t$, at which the chirp IF signal 5 is coupled to a mixer input port. As the arbitrary time, $\Delta t$, of the chirp IF signal 5 coupling increases, the duration of the common time period, $T_p$, decreases, resulting in a loss of energy in the mixer output CW signal, a decrease in IF signal resolution and an increase in "collapsing" loss, which result when two or more samples of unwanted noise are added to the desired signal. As will be discussed below, energy losses in such prior art systems can be reduced by coupling additional fixed linear FM reference signals or a reference sawtooth signal to the mixer over relatively small intervals of time. This is referred to as the step transform technique.

Figure 1B:
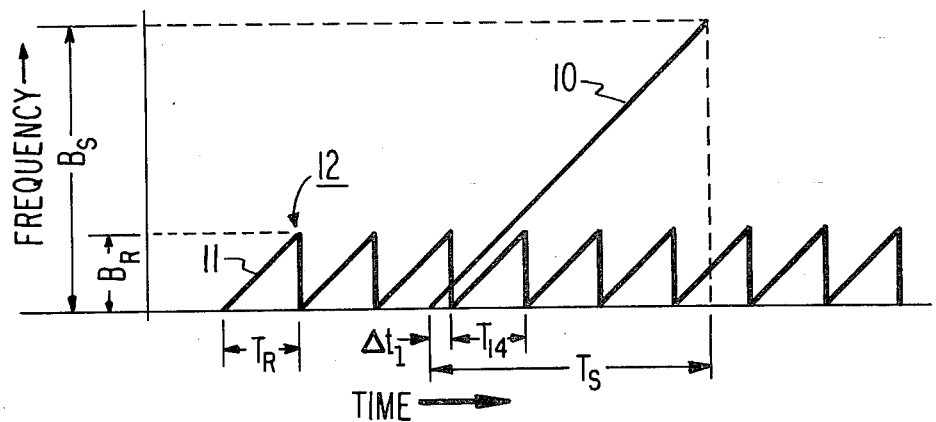
FIG. 1(b) is a Time v. Frequency plot of an IF signal and a reference sawtooth signal useful in explaining the step transform technique.

Referring to Fig. 1(b), there is shown a time-frequency plot of chirp IF signal 10 and a reference continously repeating sawtooth signal 12 useful in explaining the step transform technique. The frequency bandwidth, $B_R$, and time duration, $T_R$, of each pulse of reference sawtooth signal 12 is very smaller than the frequency bandwidth, $B_S$, and time duration, $T_S$, of IF signal 10. The inclined slope 11 of each pulse of reference sawtooth signal 12 is the same as the slope of IF signal 10. The IF signal 10 is transformed from a linear FM signal having a time duration, $T_S$, and a frequency bandwidth $B_S$, to a series of CW signals or step frequency signals having a fixed frequency and a time duration, $T_1$, when IF signal 10 is mixed with reference signal 12 in a suitable mixer (digital multiplier). The resulting step frequency signals are at a constant frequency when the slope of the reference sawtooth and IF signals 10 and 12 are the same or equal.

Figure 1C:
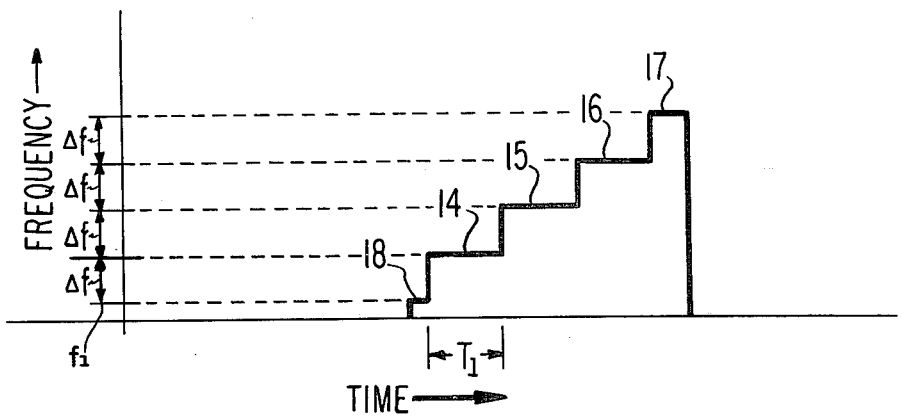
FIG. 1(c) is a Time v. Frequency plot of the step frequency signals resulting from mixing an IF signal with a reference sawtooth signal.

Referring now to FIG. 1(c), there is shown a time-frequency plot of the step frequency signals 14, 15, 16, 17 and 18 resulting from mixing IF signal 10 with reference signal 12. The frequency of each step frequency signal is proportional to the time IF signal 10 in FIG. 1(b) is coupled to the mixer relative to the time a particular pulse of the sawtooth signal is coupled to the mixer. For example, the frequency, $f_1$, of step frequency signal 18 is proportional to the relative time $\Delta t_1$ (shown in FIG. 1(b)). The time duration $T_1$, of each step frequency signal is determined by the period of time that a pulse of reference sawtooth signal 12 overlaps IF signal 10, as shown in FIG. 1(b) by the time period $T_{14}$.

Figure 2:
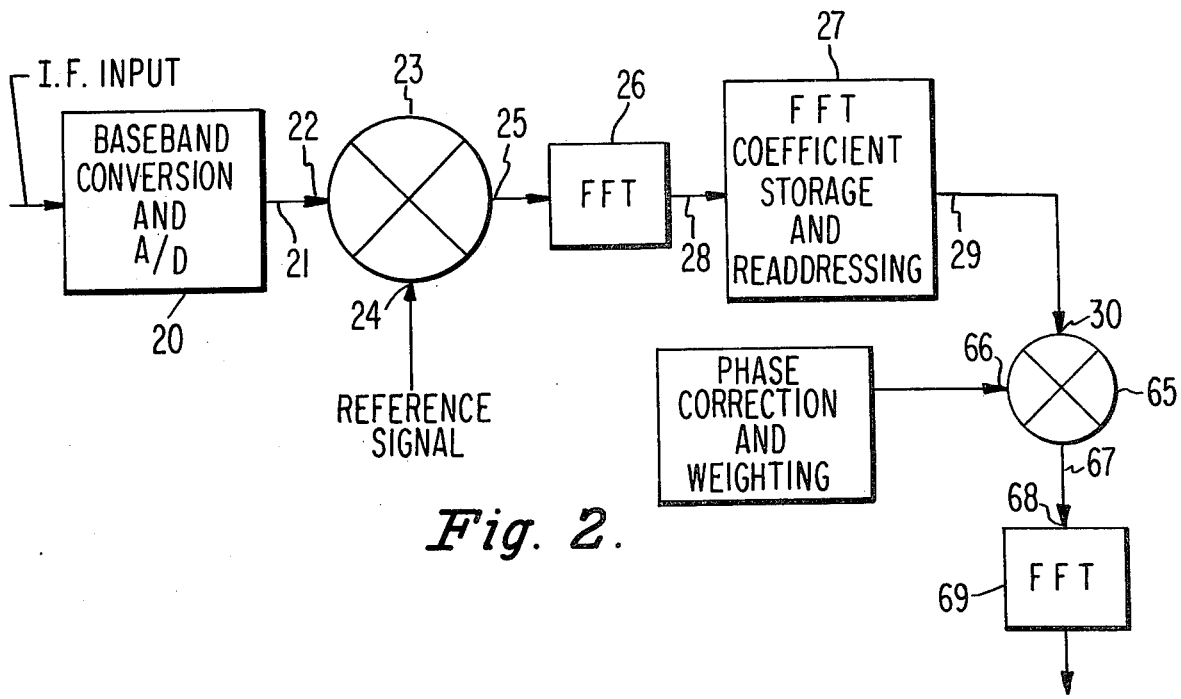
FIG. 2 is a simplified block diagram illustrating a digital matched filtering system using a step transform process according to the invention.

Referring now to FIG. 2, there is shown a simplified block diagram illustrating the implementation of a digital matched filtering system or a pulse compression filter using a step transform process according to the invention. A linear FM or a continuous analog type input signal is coupled to a suitable combined baseband and analog to digital (A/D) converter 20. An example of converter 20 is described in a book, "Radar Design Principles" by F. E. Nathanson, pp. 417–421 and pp. 560–561, published by McGraw Hill in 1969. The term "baseband" is defined as the band of frequencies occupied by a signal before it modulates a carrier (or subcarrier) frequency to form a transmitted line or radio signal. The signal in the baseband is usually distinguished from the line or radio signal by ranging over distinctly lower frequencies, which at the lower end relatively approach or may include direct current (zero frequency). Converter 20 converts the linear FM input signal to baseband by complex, in phase, I, and quadrature phase. Q, sampling, as known in the art. The resulting analog baseband signals are converted to complex baseband digital signals by a suitable A/D converter within converter 20. Thus, in a manner understood in the art as described, for example, by Nathanson, in his previously cited book, as well as in the "Radar Handbook" edited by M. I. Skolnik, published by McGraw Hill, 1970, page 35–12 ("Quadrature Channels"), digital signals, herein referred to as baseband digital signals, are generated in response to the linear frequency modulated signals (IF inputs) by the analogue to digital (A/D) converter after conversion to baseband. The baseband digital signal has two components, namely, an in phase (I) component and quadrature (Q) component, for each of the sampled IF input signals.

The digital output signal from converter 20 is conducted along conductive path 21 to input port 22 of a suitable mixer 23. Mixer 23 is arranged to perform the multiplication of the digital signals comprising both in phase (I) and quadrature phase (Q) components produced by converter 20 with a reference signal of sawtooth form. An example of a suitable mixer 23 providing the function of multiplying the complex digital signals with the sawtooth reference signal is an arrangement of digital multipliers as generally described in the above-cited paper "Digital Matched Filters Using Fast Fourier Transforms" by H. M. Halpern and R. P. Perry. Several examples of a digital multiplier referred to above are described in: an unclassified report No. AD-875506 entitled "Digital Filters for High Speed Data Processing" by H. W. Kaiser, W. F. Gehweiler, J. G. Butler, et al., the Technical Abstract Bulletin for which was published Dec. 1, 1970, by the Defense Documentation Center, Cameron Station, Alexandria, Virginia 22314, pages 4–14 and 7–1 through 7–20, and U.S. Pat. No. 3,702,393 issued Nov. 7, 1972, by P. S. Fuss, particularly FIG. 2 and the description thereof referring to the prior art of multipliers of complex exponents, particularly U.S. Pat. No. 3,517,173, issued Jan. 23, 1970, to M. J. Gilmartin, Jr., et al. A linear FM reference signal in the form of a sawtooth signal (illustrated in FIG. 1(b)) from a memory circuit, not shown, from which data defining the sawtooth signal is continuously read out, is coupled to input port 24 of mixer 23.

Thus, mixer 23 provides, by the multiplication of the complex baseband digital signals, a stepped frequency output signal for each of the I and Q components of the IF input signal. This multiplication process as will be appreciated by those skilled in this art transforms the frequency modulated signals (IF Input) to a series of continuous wave signals in steps of different fixed frequencies at time durations corresponding to the period of each sawtooth reference signal. Thus, the input signal in the frequency domain is transformed, by the complex multiplication, into stepped frequency output signals in the time domain. The resulting time domain output signals 14, 15, 16, 17, and 18 (illustrated in FIG. 1(b)) are conducted from mixer output port 25 to a suitable Fast Fourier Transform (FFT) device 26. An example of a suitable FFT device is described in U.S. Pat. No. 3,702,393 issued to Peter Fuss on Nov. 7, 1972. FFT device 26 provides a determination of the frequency spectrum in each successive frequency step illustrated in FIG. 1(c), and, thus, a transformation of a signal in the time domain to a signal in the frequency domain. FFT device 26 processes only a relatively small number of time samples contained in a single frequency step and then successively repeats the process for all the remaining mixer output signal frequency steps. The number of time samples contained in a frequency step, it will be noted, is very much smaller than the number of time samples contained in the whole uncompressed baseband signal.

The number of FFT digital logic states, S, required in a conventional FFT device 26 [or device 69, to be described] is proportional to $\log_2$ of the number of time samples contained in a signal to be processed by the FFT and is determined by the equation:

$$S = \log_2 2N \tag{1}$$

where N is the number of time samples in the uncompressed baseband signal (on path 21) to be processed. The number of FFT stages $S_1$ required in a step transform processor due to the processing of consecutive step frequency signals is:

$$S_1 = 1/2 \log_2 N \tag{2}$$

where N is the number of time samples in the uncompressed baseband signal. Thus the number of FFT logic stages required in a pulse compression filter system using a step transform process according to the present invention is much smaller than the number of FFT logic stages required by prior art systems.

The output signals of FFT device 26 are conducted to an FFT frequency coefficient storage and readdressing device 27 over conductive path 28. FFT coefficient storage and readressing device 27 is a suitable memory circuit sufficient to store all frequency coefficient signals processed by FFT 26 during successive frequency steps which together comprise the frequency bandwidth and time duration of IF frequency 10. Device 27 also readdresses or reorders the stored signals in a desired time and frequency sequences, according to the known frequency steps 14, 15, 16, 17, and 18 shown in FIG. 1(c), for transmission along conductive path 29 to input 30 of a suitable phase correction complex multiplier 65. Storage (memory) and readdressing device 27 for storing and readdressing the frequency coefficients of the signals from FFT 26 may take the form of a random access memory (RAM) suitably addressed to provide the desired output signals for phase correction by multiplier 65, corresponding to stepped signals 14–17. Such RAMs are well known, the general principles and design for which having been described in the technical literature and patents, such as, for example, described in U.S. Pat. No. 3,517,173 to Gilmartin, Jr. et al.

Multiplier 65 may take the form of complex multiplier 23, described above, and arranged in this portion of the system as will be described. As noted heretofore, a complex multiplier performs a multiplication of two mathematically complex signals by use of a well known arrangement of digital logic circuits. A phase correction and amplitude weighting reference signal from a fixed memory source, such as a read only memory (ROM) is coupled to input port 66 of multiplier 65. Phase correction complex multiplier 65 is arranged to cancel or compensate for only the quadratic phase component of the output signal from device 27 in order to remove the effect of simultaneously stepping in time and frequency due to the linear FM input signals. Thus, the complex multiplier 65, multiplying the output signals of device 27 with the reference signal (input 66) provides an output signal that has had subtracted from it the quadratic phase component of FFT signals from FFT 26. The complex multiplier output signal is conducted along a conductive path 67 to input port 68 of FFT 69 which provides a fine range resolution or frequency analysis over the entire bandwidth of the IF input signal matched filter output signal.

Thus, FFT 69 processes the output signals from the complex multiplier 65 to provide a complex digital signal representing the frequency components of the input signal with the resolution that would have been achieved had the reference signal extended over the entire period of the input signal (IF input).

Referring to FIG. 3, there is shown a more detailed block diagram of an example of a digital matched filtering system or a pulse compression filter using the step transform process of the invention. The block diagram of the digital matched filtering system illustrated in FIG. 3 is arranged, as an example, to have a time bandwidth product of 592. An IF signal or a linear FM signal from a radar receiver, not shown, is coupled to a suitable baseband and A/D converter 70. The input linear FM signal is converted to baseband, by converter 70, by complex, in phase, I, and quadrature phase, Q, sampling, as described above for complex multiplier 23. The analog input baseband signals are then time sampled at a rate corresponding to 1.23 times the Nyquist sampling rate which provides low sampling losses due to aliasing and a conversion from a complex analog signal to a complex digital signal.

The complex digital output signal having components I and Q from converter 70 is conducted along conductive path 31 to a suitable buffer delay circuit 32 which stores the coupled digital signals for a predetermined time prior to transmitting, along conductive path 35, a first buffer delay output signal to an input port 34 of a first suitable complex multiplier or mixer element 33 and transmitting, along conductive path 36, a second buffer delay output signal to an input port 37 of a second suitable complex multiplier 38. Multipliers 33 and 38 perform a complex multiplication of the complex digital output signals from converter 70 times a linear FM reference signal from a variable memory circuit. According to the invention, the start of the time of transmission of the first buffer delay output signal which is coupled to first multiplier element 33 is different from the start of the time of transmission of the second buffer delay output signal which, in turn, is coupled to second multiplier element 38 in order that a portion of the time duration of each step frequency signal from first mixer or multiplier unit 33 overlaps a portion of the time duration of each corresponding step frequency signal from second mixer or multiplier unit 38. A linear FM time weighted reference signal in the form of a sawtooth signal, from a variable memory circuit, not shown, is coupled to input port 39 of multiplier 33 and input port 40 of multiplier 38. Multiplier units 38 and 33 form the product of the signals coupled to their respective input ports. Each of units 38 and 33 may take the form of a complex multiplier 23, described above.

Time weighting or varying the amplitude of the reference sawtooth signal over the entire sawtooth time period is provided in order to reduce system sidelobe levels. The addition of time weighting to the reference sawtooth signal increases the main frequency lobe width for each Fourier coefficient generated by an FFT element and lower sidelobes according to the selected weighting function. A Dolph-Chebyshev weighting function, which has been closely approximated by Taylor weighting, is preferred and is further described on page 524 of "Radar Design Principles" by Fred E. Nathanson, previously referenced. This type of weighting function provides minimum main lobe width for a given sidelobe level. Other types of weighting such as Hamming are also useable. Such techniques are well known and need not be explained in any more detail.

The time domain CW output signal of multiplier 38 is conducted along conductive path 41 to input terminal 42 of first FFT 43. The time domain CW output signal of multiplier 33 is conducted along conductive path 44 to input terminal 45 of first FFT 43. The time domain CW output signals of multipliers 38 and 33 are in the form of the step frequency signals 14, 15, 16, 17, and 18 shown in FIG. 1(c). The number of sample points in each step frequency signal 14, 15, 16, 17, and 18 is 32 in order to easily implement binary FFT 43 (and the FFT 56 to be described). The sampling interval for first FFT 43 is 14 sample points to prevent aliasing from occurring at the point of FFT 43. Thus, first FFT 43 has a total processing rate equal to 2.8 times Nyquist sampling rate as determined by the product of the ratio of the number of sample points in each step frequency signal (32) over the sampling interval of FFT 43 (14) times the waveform sampling rate about Nyquist (1.23). FFT 43 has a clock rate of 1.4 times the Nyquist sampling rate since an FFT can process at twice the clock rate.

The output signals from first FFT 43 are conducted along conductive paths 46 and 47 to memory and readdressing device 48 having a random access memory capable of storing 1353 samples corresponding to the product of the time bandwidth product (592) times the ratio of the number sample points [32] in each step frequency signal over first FFT 43 sampling interval (14). The output signals from first FFT 43 include the entire frequency spectrum of the input baseband frequency up to the sampling frequency which is 1.23 times the Nyquist sampling rate. Therefore, relatively low level spectral components need not be stored in memory and readdressing device 48. Device 48 reorders or readdresses all the frequency samples for each course range resolution interval according to either time of processing by first FFT 43 or the frequency of the samples corresponding to the known incremental frequency steps $\Delta f$, shown in FIG. 1(c).

The output signals from memory and readdressing device 48 are conducted along conductive path 49 to input port 57 of a suitable phase correction complex multiplier 50 and along conductive path 51 to input port 52 of a suitable phase correction complex multiplier 53. A phase correction and amplitude weighting reference signal from a fixed memory source is coupled to input ports 54 and 55, respectively, of multiplier units 50 and 53 which are arranged to cancel only the quadratic phase componeent of the output signals coupled to mixer input ports 52 and 57 in order to remove the effect of simultaneously stepping in time and frequency due to the linear FM input signals. The purpose for amplitude weighting is to reduce the sidelobe level of the output signal from second FFT 56, to which the phase correction multiplier output signals are coupled. Second FFT 56 has the same clock rate, 1.4 times the Nyquist sampling rate, as the clock rate of first FFT 70 because it is desired that FFT 56 be part of a continuous process.

The output signal from second FFT 56 is conducted along conductive path 58 to a suitable logic device 59 which computes the absolute magnitude, A, of the digital complex signal, from second FFT 56. The absolute magnitude, A, of the complex digital output signal from FFT 56 is determined from the equation:

$$A = \sqrt{I^2 + Q^2} \qquad (3)$$

where I is the in phase component of the complex digital output signal from FFT 56 and Q is the quadrature phase component of the complex digital output signal from FFT 56. An example of a suitable logic device which computes the absolute value of a digital complex signal is a read only memory organized as a look-up table.

The output signal from logic device 59 is conducted along conductive path 60 to input port 61 of a suitable multiplier or mixer unit 62. An amplitude correction signal from a fixed memory source is coupled to input port 63 of multiplier 62.

The multiplier unit 62 is used for gain correction of the coefficients represented by the output signals from the logic unit 59. The coefficients include a variation caused by the bandwidth characteristics of the FFT devices. See, for example, E. D. Berglund, "A Guided Tour of the Fast Fourier Transform," IEEE Spectrum, July 1969. The output signal from multiplier 62 is the digital matched filter output signal.

The feasibility of a system embodying the present invention has been demonstrated by a computer model wherein a sawtooth signal is mixed with a "chirp" signal (linear FM signals) generating the step frequency signal. It will be apparent to those skilled in the art that the invention may be readily practiced by programming a general purpose digital computer or by hardware or apparatus of the form disclosed in the above specification.

What is claimed is:

1. A pulse compression filter for linear frequency modulated signals comprising:
   means for converting said linear frequency modulated signals to baseband digital signals having in phase (I) and quadrature (Q) components;
   means for muliplying each of said I and Q components of each of said digital signals with linear frequency modulated sawtooth reference signals to generate a stepped frequency output signal in the time domain, each step being at a frequency corresponding to the frequency of said linear frequency modulated signal for the time period during which said reference signal is multiplied with said digital signals and each step having a resultant quadratic phase component;
   a first Fourier transforming means coupled to an output terminal of said mulitplying means for transforming the I and Q components of said stepped frequency output signals from said time domain to a frequency domain;
   memory and readdressing means coupled to an output terminal of said first Fourier transforming means for storing and reordering for subsequent transmission, in a predetermined order, signals transmitted from said first Fourier transforming means having frequencies corresponding to the frequency of each of said stepped frequency output signals from said multiplying means;

means for subtracting from the output signal of said memory and readdressing means quadratic quadriatic phase component of the output signal of said memory and readdressing means; and a second Fourier transforming means coupled to an output terminal of said subtracting means for frequency analyzing the output signal from said subtracting means.

2. A pulse compression filter according to claim 1, wherein said converting means include a combined baseband and analog to digital converter.

3. A pulse compression filter according to claim 1, wherein said subtracting means include a complex signal multiplier means having a first input port coupled to a memory and readdressing output port and a second input port coupled to a phase correction and time weighting reference signal source.

4. A pulse compression filter for linear frequency modulated signals comprising:

means for converting said linear frequency modulated signals to baseband digital signals having in phase (I) and quadrature (Q) phase components;

signal delay means coupled to an output terminal of said converter means for providing a predetermined delay time for digital signals transmitted from a first output terminal relative to digital signal transmission time from a second output terminal;

means for multiplying said digital signals from said delay means with linear frequency modulated sawtooth reference signals to generate first and second stepped frequency output signals in a time domain, each step being at a frequency corresponding to the frequency of said linear frequency modulated signals for the time period during which said reference signal is respectively multiplied with said digital signals, and each step having a resultant quadratic phase component;

a first Fourier transforming means coupled to first and second ouput terminals of said multiplying means for transforming the I and Q components of said first and second stepped output signals from said time domain to a frequency domain;

memory and readdressing means coupled to first and second output terminals of said first Fourier transforming means for storing and reordering for subsequent transmission in a predetermined order frequency coefficients of signals transmitted from said first Fourier transforming means;

means for subtracting from the output signal of said memory and readdressing means said quadratic phase component of the output signals of said memory and readdressing means; and a second Fourier transforming means coupled to first and second output terminals of said subtracting means for frequency analyzing the output signal from said subtracting means.

5. A pulse compression filter according to claim 4, further including means for computing the absolute magnitude of output signals from said second Fourier transforming means.

6. A pulse compression filter according to claim 5, further including means responsive to said absolute magnitude of said second Fourier transforming means for correcting error signals introduced by said second Fourier transforming means.

7. A pulse compression filter according to claim 6, wherein said correcting means include a multiplying means for mixing said absolute magnitude of said second Fourier transforming means output signal with a gain correction reference signal.

* * * * *